(12) United States Patent
Saraswat et al.

(10) Patent No.: US 7,242,179 B2
(45) Date of Patent: Jul. 10, 2007

(54) DIGITAL CIRCUIT FOR FREQUENCY AND TIMING CHARACTERIZATION

(75) Inventors: Ruchir Saraswat, Ghaziabad (IN); Balwant Singh, Greater Noida (IN); Hina Mushir, Delhi (IN)

(73) Assignee: STMicroelectronics Pvt. Ltd., Utta Pradesh (IN)

( * ) Notice: Subject to any disclaimer, the term of this patent is extended or adjusted under 35 U.S.C. 154(b) by 0 days.

(21) Appl. No.: 11/023,054

(22) Filed: Dec. 27, 2004

(65) Prior Publication Data

US 2005/0182586 A1 Aug. 18, 2005

(30) Foreign Application Priority Data

Dec. 26, 2003 (IN) .................. 1619/DEL/2003

(51) Int. Cl.
*G01R 31/28* (2006.01)

(52) U.S. Cl. .................................. 324/158.1

(58) Field of Classification Search ............ 324/76.11, 324/76.39, 765, 763, 158.1; 714/726; 702/117
See application file for complete search history.

(56) References Cited

U.S. PATENT DOCUMENTS 5,266,921 A * 11/1993 Wilson ..................... 340/384.5
5,982,189 A * 11/1999 Motika et al. ............... 324/763
6,121,779 A * 9/2000 Schutten et al. ............ 324/627
2002/0157082 A1* 10/2002 Shau ........................... 716/19

* cited by examiner

*Primary Examiner*—Ha Tran Nguyen
*Assistant Examiner*—Tung X. Nguyen
(74) *Attorney, Agent, or Firm*—Lisa K. Jorgenson; Stephen Bongini; Fleit Kain Gibbons Gutman Bongini & Bianco P.L.

(57) ABSTRACT

A digital circuit operating frequency characterizer provides a combination of frequency and duty cycle characterization. The digital circuit operating frequency characterizer includes a programmable frequency generator, a programmable edge variator, a test engine, and a control circuit. The programmable frequency generator provides one or more output signals, and the programmable edge variator is coupled to one or more outputs of the programmable frequency generator for adjusting duty cycle. The test engine uses the outputs from the programmable edge variator and/or programmable frequency generator to apply a defined test signal sequence to a circuit under test and produce a status output after evaluating the outputs received from the circuit under test. The control circuit is connected to the control inputs of the programmable frequency generator, programmable edge variator, and the status output of the test engine. The control circuit synchronizes their operations and performs the combination of frequency and duty cycle characterization.

21 Claims, 2 Drawing Sheets

DIGITAL CIRCUIT FOR FREQUENCY AND TIMING CHARACTERIZATION

CROSS-REFERENCE TO RELATED APPLICATIONS

This application is based upon and claims priority from prior Indian Patent Application No. 1619/Del/2003, filed Dec. 26, 2003, the entire disclosure of which is herein incorporated by reference.

FIELD OF THE INVENTION

The present invention relates to an improved digital circuit for frequency and timing characterization, and more particularly to on chip timing and frequency characterization.

BACKGROUND OF THE INVENTION

In order to exactly determine the performance of digital circuits, it is required to test them for different frequencies and duty cycles. The existing methods for testing digital circuits offer either frequency testing or duty cycle testing, but do not test for combinations of these parameters. Also, the conventional testers are generally external to the chip. The tester applies different frequencies to the circuit through the IO pads. The frequency limitation of the IO pads limits the frequency being fed into the circuit. The manual operations involved in the testing process further increase the testing time of the circuit. Owing to these limitations, designers have to rely on simulation results, which inherently differ from the behavior on the actual silicon.

U.S. Pat. No. 5,815,016 and U.S. Pat. No. 5,920,216 describe different approaches to generating a variable clock using voltage controlled programmable delays and synchronized clock frequencies or phases. However, these approaches do not provide any mechanism to determine maximum operational clock frequency.

U.S. Pat. No. 6,081,143 and U.S. Pat. No. 6,272,439 describe frequency monitors that compare two frequencies and accordingly either align the phase of a PLL or select/reject the input signals. However, they do not compute the maximum operating frequency and also do not provide any mechanism to characterize both frequency and duty cycle.

Thus, there is a need to develop a system that overcomes the above drawbacks.

Also, there is a need to develop a system that can provide both frequency and duty cycle characterization.

SUMMARY OF THE INVENTION

It is an object of the present invention to obviate the above-mentioned and other drawbacks and to provide an on-chip solution for frequency and timing characterization of integrated circuits so as to increase the accuracy of characterization for higher frequencies.

Another object of the present invention is to provide a characterizer that can characterize multiple integrated circuits and optimally determine a common operating frequency so as to provide synchronized operation of different circuits.

Yet another object of the present invention is to provide a characterizer that can be used for frequency characterization, for timing characterization, or for both frequency and timing characterization of one or more circuits.

One embodiment of the present invention provides a digital circuit operating frequency characterizer for providing a combination of frequency and duty cycle characterization. The characterizer includes a programmable frequency generator, a programmable edge variator, a test engine, and a control circuit. The programmable frequency generator provides one or more output signals, and the programmable edge variator is coupled to at least one output of the programmable frequency generator for adjusting duty cycle. The test engine uses the outputs from the programmable edge variator and/or programmable frequency generator to apply a defined test signal sequence to the circuit under test and produces a status output after evaluating the received outputs. The control circuit is connected to the control inputs of the programmable frequency generator, programmable edge variator and the status output of the test engine, and synchronizes their operations and performs the combination of frequency and duty cycle characterization.

Another embodiment of the present invention provides a method for characterizing digital circuit operating frequency including combined frequency and duty cycle effects. According to the method, at least one output signal of programmable frequency is generated, and the duty cycle of at least one output signal is programmatically adjusted. The output signals are used to apply a defined test signal sequence to the circuit under test and produce a status output after evaluating the received outputs. These operations are synchronized to perform combinations of frequency and duty cycle characterization in the desired manner.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

One preferred embodiment of the present invention provides an improved digital circuit operating frequency characterizer for providing a combination of frequency and duty cycle characterization. The characterizer includes a programmable frequency generator, a programmable edge variator, a test engine, and a control circuit. The programmable frequency generator provides one or more output signals, and the programmable edge variator is coupled to at least one output of the programmable frequency generator for adjusting duty cycle. The test engine uses the outputs from the programmable edge variator and/or programmable frequency generator to apply a defined test signal sequence to the circuit under test and produces a status output after evaluating the received outputs. The control circuit is connected to the control inputs of the programmable frequency generator, programmable edge variator and the status output of the test engine, and synchronizes their operations and performs the characterization.

Preferably, the programmable frequency generator is a Phased Locked Loop or a Ring Oscillator with a feedback tap selector for providing programmable output. In one embodiment, the edge variator is a chain of delay elements connected to a multiplexer for providing programmable delay and the test engine includes a Built In Self Test (BIST) generator.

Preferably, the entire system is implemented on the same integrated circuit as the electronic circuit under test to provide on-chip characterization, with the on-chip gate delays being characterized by a Ring oscillator.

Another preferred embodiment of the present invention provides a method for characterizing digital circuit operating frequency including combined frequency and duty cycle effects. According to the method, at least one output signal of programmable frequency is generated, and the duty cycle of at least one output signal is programmatically adjusted. The output signals are used to apply a defined test signal sequence to the circuit under test and produce a status output after evaluating the received outputs. These operations are synchronized to perform the characterization in the desired manner.

Preferably, the programmable frequency signals are generated using a Phased Locked Loop or a Ring Oscillator with a feedback tap selector for providing programmable output. In one embodiment, the duty cycle is adjusted by selecting an output from a chain of delay elements. Preferably, the testing sequence includes a Built In Self Test (BIST).

Exemplary embodiments of the present invention will now be described in detail with reference to the figures.

Figure 1:
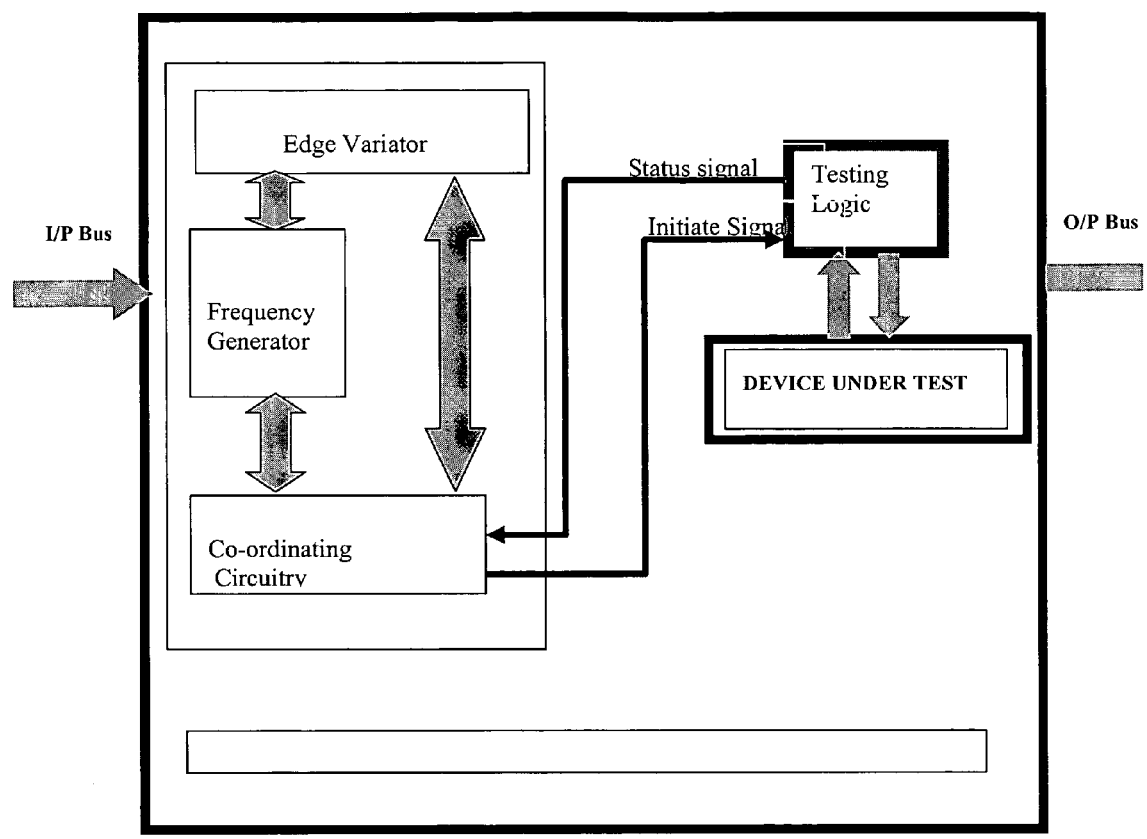
FIG. 1 shows a block diagram of a frequency and timing characterizer according to a preferred embodiment of the present invention.

FIG. 1 shows a block diagram of a frequency and timing characterizer according to a preferred embodiment of the present invention. As shown, the characterizer includes a programmable frequency generator FG connected to an edge variator EV, and a control (or co-ordinating) circuit CC. Test logic couples the circuit under test to the control circuit as shown in the figure. In this embodiment, the test circuit logic is a Built In Self Test (BIST) circuit. In another embodiment, the edge variator EV is connected directly to the control circuit CC.

The programmable frequency generator FG and edge variator EV generate a band of frequencies and duty cycles, respectively. The control circuit CC programs frequency generator FG and edge variator EV to generate a desired frequency and duty cycle. This signal is then applied to test circuit logic that initiates and provides this signal to the test circuit and determines whether the circuit under test operates under the specification limits for this signal. The circuit under test is tested for all the desired frequencies and duty cycle combinations. The characterizer provides the flexibility to start the testing of circuit from either high or low frequency, and the selection of duty cycle can be done according to user requirements.

Figure 2:
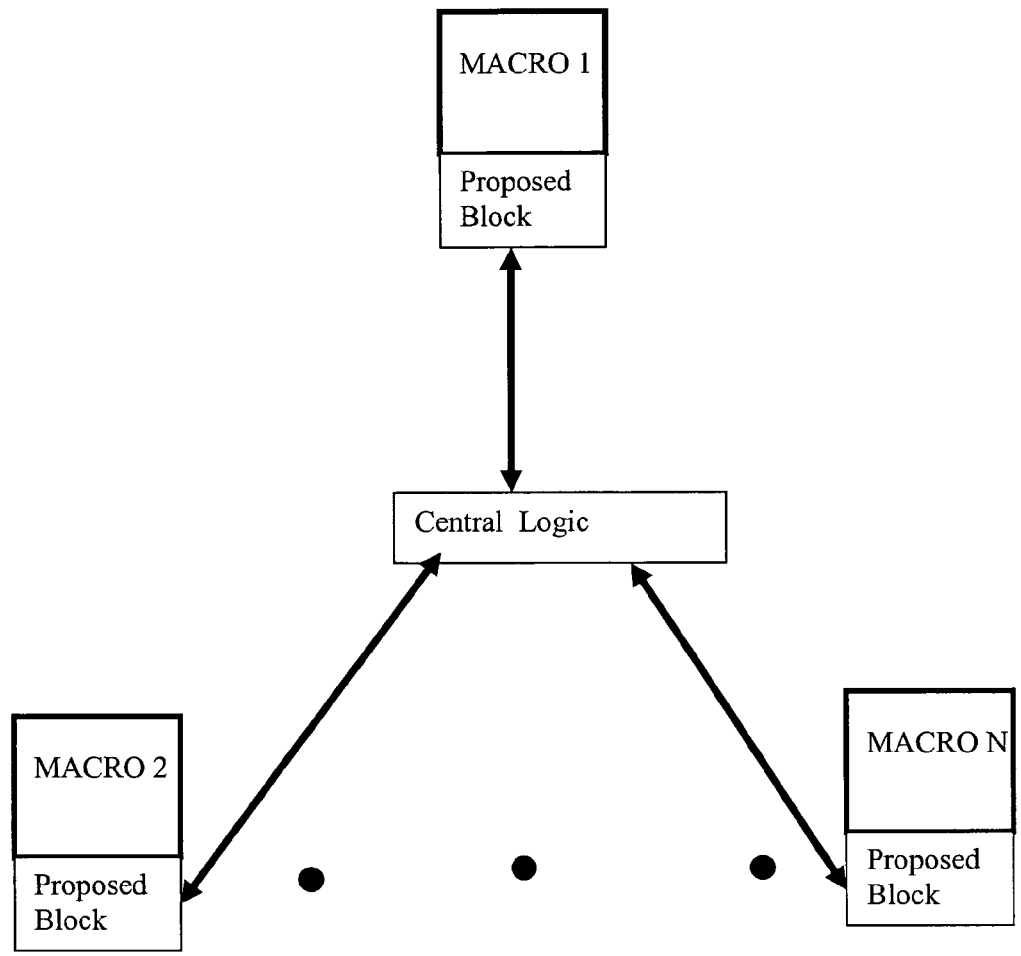
FIG. 2 shows a block diagram of a frequency and timing characterizer for optimally characterizing more than one digital circuit according to another embodiment of the present invention.

FIG. 2 shows a frequency and timing characterizer according to another embodiment of the present invention for characterizing more than one test circuit and optimally determining a common operating frequency of the test circuits. As shown, this is achieved by connecting the digital circuits to the characterizer in the manner shown in the figure. The test response of each circuit is registered in the characterizer and there is optimally selected a common operating frequency of each digital circuit.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A digital circuit operating frequency characterizer providing a combination of frequency and duty cycle characterization, the digital circuit operating frequency characterizer comprising:
   a programmable frequency generator providing at least one output signal;
   a programmable edge variator receiving the at least one output signal of the programmable frequency generator, the programmable edge variator adjusting the duty cycle of the at least one output signal;
   a test engine receiving the at least one output signal, the test engine applying a defined test signal sequence to a circuit under test, determining whether the circuit under test operates under the specification limits, and producing a status output after evaluating the outputs received from the circuit under test; and
   a control circuit coupled to at least one control input of the programmable frequency generator, the programmable edge variator, and the status output of the test engine, the control circuit synchronizing operations and performing the combination of frequency and duty cycle characterization.

2. The digital circuit operating frequency characterizer as defined in claim 1, wherein the programmable frequency generator comprises a Phased Locked Loop.

3. The digital circuit operating frequency characterizer as defined in claim 1, wherein the programmable frequency generator comprises a Ring Oscillator with a feedback tap selector for providing programmable output.

4. The digital circuit operating frequency characterizer as defined in claim 1, wherein the edge variator comprises:
   a multiplexer; and
   a chain of delay elements coupled to the multiplexer for providing programmable delay.

5. The digital circuit operating frequency characterizer as defined in claim 1, wherein the test engine includes a Built In Self Test generator.

6. The digital circuit operating frequency characterizer as defined in claim 1, wherein the digital circuit operating frequency characterizer is implemented on the same integrated circuit as the electronic circuit under test so as to provide on-chip characterization.

7. The digital circuit operating frequency characterizer as defined in claim 6, wherein on-chip gate delays are characterized by a Ring oscillator.

8. The digital circuit operating frequency characterizer as defined in claim 1, wherein the edge variator comprises a chain of delay elements, the duty cycle of the at least one output signal being adjusted by selecting an output from the chain of delay elements.

9. The digital circuit operating frequency characterizer as defined in claim 1, wherein the programmable frequency generator and programmable edge variator produce the at least one output signal with a band of frequencies and duty cycles.

10. The digital circuit operating frequency characterizer as defined in claim 1, wherein the control circuit programs the frequency generator and the edge variator so that the at least one output signal has a desired frequency and a desired duty cycle.

11. The digital circuit operating frequency characterizer as defined in claim 1, wherein the test engine receives the at least one output signal from the programmable edge variator.

12. The digital circuit operating frequency characterizer as defined in claim 1, wherein the output signal of the programmable edge variator is not fed back to the frequency generator.

13. A method for characterizing digital circuit operating frequency including combinations of frequency and duty cycle, the method comprising the steps of:
  generating at least one output signal of programmable frequency;
  programmatically adjusting the duty cycle of the at least one output signal;
  using a test engine that receives the at least one output signal to apply a defined test signal sequence to a circuit under test, determine whether the circuit under test operates under the specification limits, and produce a status output after evaluating the outputs received from the circuit under test, and
  synchronizing operations to perform a combination of frequency and duty cycle characterization.

14. The method as defined in claim 13, wherein the generating step comprises using a Phased Locked Loop to generate the at least one programmable frequency signal.

15. The method as defined in claim 13, wherein the generating step comprises generating the at least one programmable frequency signal using a Ring Oscillator with a feedback tap selector for providing programmable output.

16. The method as defined in claim 13, wherein the adjusting step comprises selecting an output from a chain of delay elements so as to adjust the duty cycle of the at least one output signal.

17. The method as defined in claim 13, wherein the test engine includes a Built In Self Test generator.

18. An integrated circuit implemented on a single semiconductor substrate, the integrated circuit comprising:
  a digital circuit for processing information; and
  a digital circuit operating frequency characterizer for providing a combination of frequency and duty cycle characterization, the digital circuit operating frequency characterizer including:
    a programmable frequency generator providing at least one output signal;
    a programmable edge variator receiving the at least one output signal of the programmable frequency generator, the programmable edge variator adjusting the duty cycle of the at least one output signal;
    a test engine receiving the at least one output signal, the test engine applying a defined test signal sequence to the digital circuit, determining whether the digital circuit operates under the specification limits, and producing a status output after evaluating the outputs received from the digital circuit; and
    a control circuit coupled to at least one control input of the programmable frequency generator, the programmable edge variator, and the status output of the test engine, the control circuit synchronizing operations and performing the combination of frequency and duty cycle characterization.

19. The integrated circuit as defined in claim 18, wherein the programmable frequency generator of the digital circuit operating frequency characterizer comprises a Phased Locked Loop.

20. The integrated circuit as defined in claim 18, wherein the programmable frequency generator of the digital circuit operating frequency characterizer comprises a Ring Oscillator with a feedback tap selector for providing programmable output.

21. The integrated circuit as defined in claim 18, wherein the edge variator of the digital circuit operating frequency characterizer comprises:
  a multiplexer; and
  a chain of delay elements coupled to the multiplexer for providing programmable delay.

* * * * *